United States Patent
Amann et al.

(10) Patent No.: US 7,170,917 B2
(45) Date of Patent: Jan. 30, 2007

(54) SURFACE-EMITTING SEMICONDUCTOR LASER

(75) Inventors: Markus-Christian Amann, München (DE); Markus Ortsieffer, Zwiesel (DE)

(73) Assignee: Vercilas GmbH, Garching (DE)

( * ) Notice: Subject to any disclaimer, the term of this patent is extended or adjusted under 35 U.S.C. 154(b) by 177 days.

(21) Appl. No.: 10/468,183

(22) PCT Filed: Feb. 15, 2002

(86) PCT No.: PCT/EP02/01656

§ 371 (c)(1),
(2), (4) Date: Apr. 28, 2004

(87) PCT Pub. No.: WO02/065599

PCT Pub. Date: Aug. 22, 2002

(65) Prior Publication Data

US 2004/0179568 A1    Sep. 16, 2004

(30) Foreign Application Priority Data

Feb. 15, 2001    (DE) ................................ 101 07 349

(51) Int. Cl.
*H01S 5/183* (2006.01)
(52) U.S. Cl. .................... 372/50.124; 372/99
(58) Field of Classification Search ............ 372/50.124
See application file for complete search history.

(56) References Cited

U.S. PATENT DOCUMENTS 5,661,075 A    8/1997    Grodzinski et al.
5,831,295 A *  11/1998   Huang et al. ............... 257/192
5,936,266 A *  8/1999    Holonyak et al. .......... 257/106

(Continued)

FOREIGN PATENT DOCUMENTS

DE    101 07 349 A1    8/2002

(Continued)

OTHER PUBLICATIONS

Ortsiefer, M, et al.: "Low-Threshold Index-Guided 1.5 Mum Long-Wavelenght Vertical-Cavity Surface-Emitting Laser With High Efficiency", Applied Physics Letters, American Institute of Physics, New York, US, p. 2179-2181, Apr. 17, 2000.

(Continued)

*Primary Examiner*—Armando Rodriguez
*Assistant Examiner*—Rory Finneren
(74) *Attorney, Agent, or Firm*—Lathrop & Gage LC

(57) ABSTRACT

The invention relates to a semiconductor laser of the surface emitting type. In order to provide a semiconductor laser which can be operated at normal ambient temperatures and has stable long-term characteristics, the semiconductor laser comprises an active zone having a pn transition, a first n-doped semiconductor layer on the n side of the active zone, a structured tunnel contact on the p side of the active zone, which forms a conductive transition to a second n-doped semiconductor layer on the p-side of the active zone, a structured dielectric mirror, which is applied to the second n-doped semiconductor layer, a contact layer, which forms a contact with the second n-doped semiconductor layer at the places where the dielectric mirror is not applied, and a diffusion barrier between the contact layer and the second n-doped semiconductor layer.

27 Claims, 7 Drawing Sheets

U.S. PATENT DOCUMENTS 6,052,398 A    4/2000    Brillouet et al.

FOREIGN PATENT DOCUMENTS

EP    0 184 117 A    6/1986
WO    WO 98/07218 A    2/1998

OTHER PUBLICATIONS

Nakagawa, S., et al.: "88° Continuous-Wave Operation Of Apertured, Intracavity Contacted, 1.55 Mum Vertical-Cavity Surface-Emitting Lasers" Applied Physics Letters, American Institute of Physics, New York, US, p. 1337-1339, Mar. 5, 2001.

Ortsiefer, M., et al: "Submilliamp Long-Wavelength InP-Based Vertical-Cavity Surface-Emitting Laser With Stable Linear Polarisation" Electronics Letters, IEE Stevenage, p. 1124-1126, Jun. 22, 2000.

Ortsiefer, M, et al: "90° C Continuous-Wave Operation Of 1.83-Mum Vertical-Cavity Surface-Emitting Lasers" IEEE Photonics Technology Letters, IEE Inc., New York, US, pp. 1435-1437, Nov. 2000.

Schraud, G, et al: "Substrateless Singlemode Vertical Cavity Surface-Emitting GaAs/GaALAs Laser Diode" Electronics Letters, IEE Stevenage, GB, pp. 238-239, Feb. 3, 1994.

Liau, Z.L., et al: "A Novel Technique For Gainasp/Inp Buried Heterostructure Laser Fabrication" Applied Physics Letters, American Institute of Physics, New York, US, p. 568-570, Apr. 1, 1982.

\* cited by examiner

SURFACE-EMITTING SEMICONDUCTOR LASER

BACKGROUND

The invention relates to a semiconductor laser of the surface-emitting type having an active zone with a pn transition (pn junction).

Semiconductor lasers are in principle semiconductor diodes operated in the direction of flow which generate coherent light of a narrow spectral band by stimulated emission and shine it in a directed manner. The population inversion needed for the laser process is achieved by an injection of current into the pn transition. As a supporting measure the starting material may be highly doped. In the region of the pn transition in which the electrons and holes are adjacent to one another in space, the induced radiant recombination then takes place.

The optical resonator is formed, in the simplest case, from two opposing optical mirrors at right angles to the pn transition. In this construction, emission takes place in the plane perpendicular to the injection of current.

Alternatively, surface-emitting semiconductor laser diodes are already known in which emission takes place perpendicularly to the plane of the active zone. (i.e., vertical-cavity surface-emitting laser diode, VCSEL).

From U.S. Pat. No. 5,936,266 (issued Aug. 10, 1999), a semiconductor laser of the surface emitting type is known in which tunnel contact over the entire surface is used to create a conductive transition between the p side of the active zone and an n-doped semiconductor layer. This means that n-doped semiconductor layers can also be used on the p side of the active zone, resulting in electrical series resistances which are 10–30 times lower owing to the improved electrical conductivity of n-doped semiconductors. However, one disadvantage of tunnel contact over the whole surface is that additional oxide layers have to be provided for controlled guidance of the current, which result in a complex and thermally unfavourable structure of the semiconductor laser as a whole.

U.S. Pat. No. 6,052,398 (issued Apr. 18, 2000; the "'398 patent") describes a semiconductor laser of the surface emitting type which has a structured tunnel contact, the resonator being formed by two semiconductor mirrors. The problem here is that the heat has to be removed through one of the mirrors, which usually consist of ternary or quaternary mixed crystals with correspondingly poor thermal conductivity. Alternatively, the '398 patent also mentions the use of a dielectric mirror on the p side of the active zone without mentioning any particular advantages attaching to this alternative solution. In practice, this solution is not used because reflective contact layers (usually gold or silver) may diffuse into the adjacent semiconductor layers, with the result that long term stability cannot be guaranteed.

SUMMARY

The aim of the invention is to provide a semiconductor laser which can be operated under normal ambient temperatures and which has stable long term characteristics.

This problem is solved by a semiconductor laser having features of a semiconductor layer of the surface emitting type with an active zone having a pn transition, with a first n-doped semiconductor layer on the n-side of the active zone, with structured tunnel contact (tunnel junction) on the p side of the active zone which forms a conductivity transition or conductive junction to a second n-doped semiconductor layer on the p side of the active zone, with a structured dielectric mirror which is applied to the second n-doped semiconductor layer, with a contact layer forming a contact to the second n-doped semiconductor layer at the point where the dielectric mirror is not applied, and with a diffusion barrier between the contact layer and the second n-doped semiconductor layer.

The solution according to the invention is based on the finding that on the p side of the active zone the n-doped semiconductor layer located thereon is sealed off from a contact layer both by a dielectric mirror and also by a diffusion barrier. The contact layer forms a heat sink and thus allows effective removal of heat. Gold or silver, in particular, are suitable for producing a good heat sink. However, it has been found that components from these layers may diffuse into the second n-doped semiconductor layer and destroy it. The diffusion barrier, together with the dielectric mirror, therefore prevents components from the contact layer from diffusing into the second n-doped semiconductor layer and, in the worst case, entering the active zone and suppressing radiant recombination therein. Thus, there is a free choice of materials for the heat sink, in order to achieve thermally optimised construction of a semiconductor laser.

A process for applying a diffusion barrier comprises features of applying, in a first region, the diffusion barrier to the second n-doped semiconductor layer. In a second region a dielectric mirror is applied to the second n-doped semiconductor layer, and the contact layer is applied at least over the diffusion barrier.

To summarize, the semiconductor laser according to the invention may have certain of the following advantages:

As a result of the structured tunnel contact (tunnel junction) on the p side of the active zone the remaining semiconductor layers on the p side of the active zone may be n-doped. Because of the substantially improved electrical conductivity of n-doped semiconductors this results in electrical series resistances which are approximately 10–30 times lower.

The first n-doped semiconductor layer on the n-side of the active zone serves as a charged carrier inclusion layer.

On the p side, a highly reflective dielectric mirror is used. A metallic covering layer may be provided to increase reflectivity.

The heat is removed through the p side, i.e., essentially by the tunnel contact (i.e., tunnel junction), and the dielectric mirror, which may have a low thermal resistance.

Between the active area and the dielectric mirror a thermally conductive layer (e.g. a binary InP layer) may be used for expansion and for removal of the heat.

An integrated, e.g., galvanically produced, metal heat sink which is provided over a larger area on the p side may provide efficient heat removal. The metal layer may simultaneously provide mechanical stabilization, which is particularly advantageous when the substrate is completely removed on the n-side, e.g. in order to obtain an increased jump in the refractive index between the epitaxial mirror and air.

The light decoupling is preferably carried out through the n-side (based on the active layer), so that the partially absorbing tunnel contact is located on the opposite side from the light decoupling, as a result of which higher illumination power can be achieved.

Another inventive solution for which independent protection is sought consists in the construction of the dielectric mirror. Conventional dielectric mirrors consist of ternary or quaternary mixed crystals with correspondingly poor thermal conductivity. To improve the heat conductivity, the '398 patent proposes the use of a metamorphic mirror of epitaxial GaAs/AlAs. This binary substance does indeed have better heat conductivity; but it has poor lattice matching to the adjacent layers, which means that as a result of crystal displacements only limited long term stability is achievable.

It is therefore one embodiment hereof to provide for the dielectric mirror an alternating series of binary layers in such a way that the binary layers on average have good lattice matching to the adjacent layers. For example, the binary layers may comprise alternately of InAs and GaAs with layer thicknesses of 3 nm in each case, so that the average lattice spacing of the binary layers corresponds to the adjacent semiconductor layer.

This solution may be implemented on its own or in conjunction with the solution described above.

Other preferred embodiments will become apparent from the description below. Naturally, the features recited therein and those which will be explained hereinafter may be used not only in the combination specified but also in other combinations or on their own.

According to a preferred embodiment, an adhesion promoter is provided between the diffusion barrier and the second semiconductor layer. Preferably, the adhesion promoter consists of a layer of titanium and the diffusion barrier consists of a layer of platinum. In addition, to increase the reflectivity between the dielectric mirror and the contact layer, a metallic covering layer may be provided. To simplify the production process, the metallic covering layer may be provided through and between the diffusion barrier and the contact layer. Suitable materials are gold for the metallic covering layer and gold or silver for the contact layer.

The dielectric mirror comprises, for example, a plurality of dielectric λ/4 pairs of layers, preferably formed from materials with a large difference in refractive index such as for example MgF2 and Si.

It is particularly advantageous if the dielectric mirror has a lower heat resistance than the semiconductor materials, as this ensures a directed heat conduction. For this purpose the second n-doped semiconductor layer may consist of an InP semiconductor, for example.

According to another preferred embodiment, the contact layer is applied sufficiently thick to act as a heat sink. Preferably, the contact layer is applied over the whole surface and also covers the dielectric mirror. The thickness of the contact layer may be 10 μm, for example.

According to another preferred embodiment, the light decoupling takes place on the n side of the active zone. Preferably, for this reason, the substrate is removed from the n side of the active zone.

BRIEF DESCRIPTION OF THE DRAWINGS

The invention will now be described more fully with reference to various embodiments referring to the accompanying drawings, wherein.

DETAILED DESCRIPTION OF THE DRAWINGS

Five embodiments of the invention are now described with reference to FIGS. 1 to 5. What all these embodiments have in common is a diffusion barrier between the contact layer and the n-doped semiconductor layer on the p side of the active zone. The process steps for forming the diffusion barrier will be explained with reference to FIGS. 6 and 7.

Figure 1:
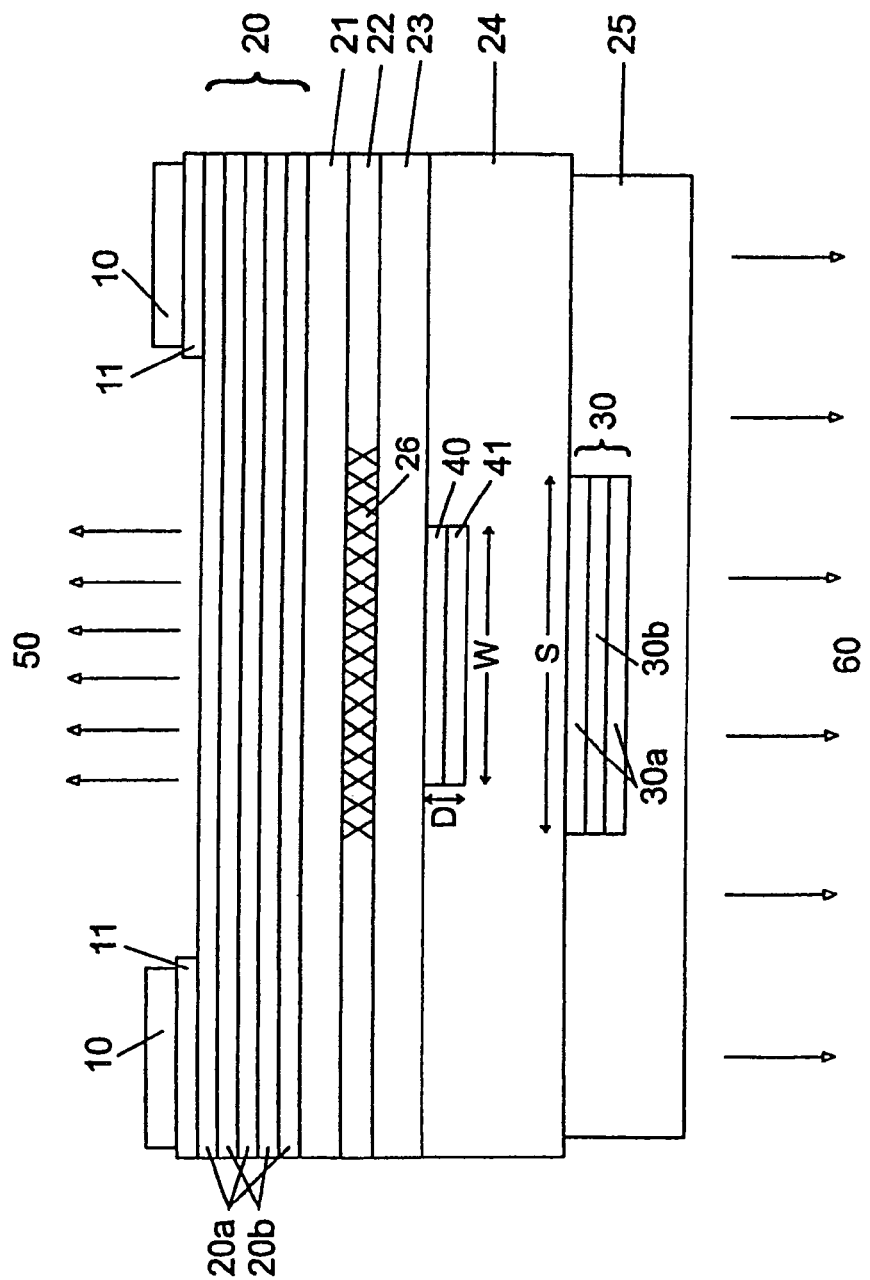
FIG. 1 shows a first embodiment of the invention.

FIG. 1 shows a first embodiment of the invention. The current is supplied through the lower p contact (25), which simultaneously operates as an integrated heat sink, and the n-contacts (10), which may optionally be applied to a highly doped contact layer (11). The light escapes upwards (50) while the heat is removed downwards (60) through the integrated heat sink (25), e.g., onto a copper housing. The active laser region (26) is situated within the active layer (22), which preferably consists of a braced multi-layer structure (Multi-quantum well: MQW structure). The lateral dimensions of the active laser region are determined by the flow of current through the structured tunnel contact or tunnel junction consisting of a highly p-doped layer (40) and a highly n-doped layer (41), which is laterally circular in structure, for example (diameter W), and by the lateral expansion of the current in the layer (23) and the charge carrier diffusion in the active layer (22). The vertical limit of the electrons and holes injected into the active region is provided by the n- and p-doped boundary layers (21) and (23), respectively.

On the n side is the mirror (20) produced epitaxially according to the prior art and consisting for example of a plurality (e.g., 36) of λ/4 pairs of layers of two semiconductor materials (20*a*) and (20*b*) with different refractive indices. The lower mirror (30) consists of several (e.g., 1.5 or 2.5) pairs of dielectric λ/4 pairs of layers (30*a*) and (30*b*), such as MgF2 (30*a*) and Si (30*b*), for example. Its reflectivity is additionally increased by the reflection on the lower interface with the integrated heat sink (25), particularly if the latter consists of highly reflective metals such as gold or silver.

In the vertical direction, the tunnel contact is placed in the minimum amount of the electromagnetic field so that there are no or only very negligible optical losses in the highly doped and absorbent layers (40) and (41). For the same reason the tunnel contact should be as thin as possible; favorable values for the total thickness D are 20 to 60 nm for 1.3 to 1.55 μm VCSEL. The second semiconductor layer (24) on the p side may be (highly) n-doped by virtue of the tunnel contact or may have a gradient in the n doping with lower doping adjacent to the layer (23) and higher doping on the underside towards the mirror (30) and the integrated heat sink (25). In each case there is a blocking npn structure adjacent to the tunnel contact, which blocks the flow of current at this point so that the entire current flows through the tunnel contact into the active layer. The layer (24) should preferably have good thermal conductivity in order to improve and expand the flow of heat from the active region (e.g., to a multiple of the diameter S), thus giving the advantage of reduced overall heating.

Thanks to the low impedance of the n-doped layer (24) the lateral supply of current adjacent to the insulating dielectric mirror (30) may take place without any substantial electric losses and without generating heat. The lateral dimension S of the dielectric mirror is preferably selected to be at least as great as the lateral dimension W of the tunnel contact. It is particularly useful if the dimension S is about 3–8 μm greater than W (typically 2–20 μm for 1.3 μm and 1.55 μm VCSELs), since the lateral expansion of the optical field, as a result of the wave guiding by the amplification and thermal lensing of the active laser region (26), is restricted to roughly the dimension of the active laser region.

Figure 2:
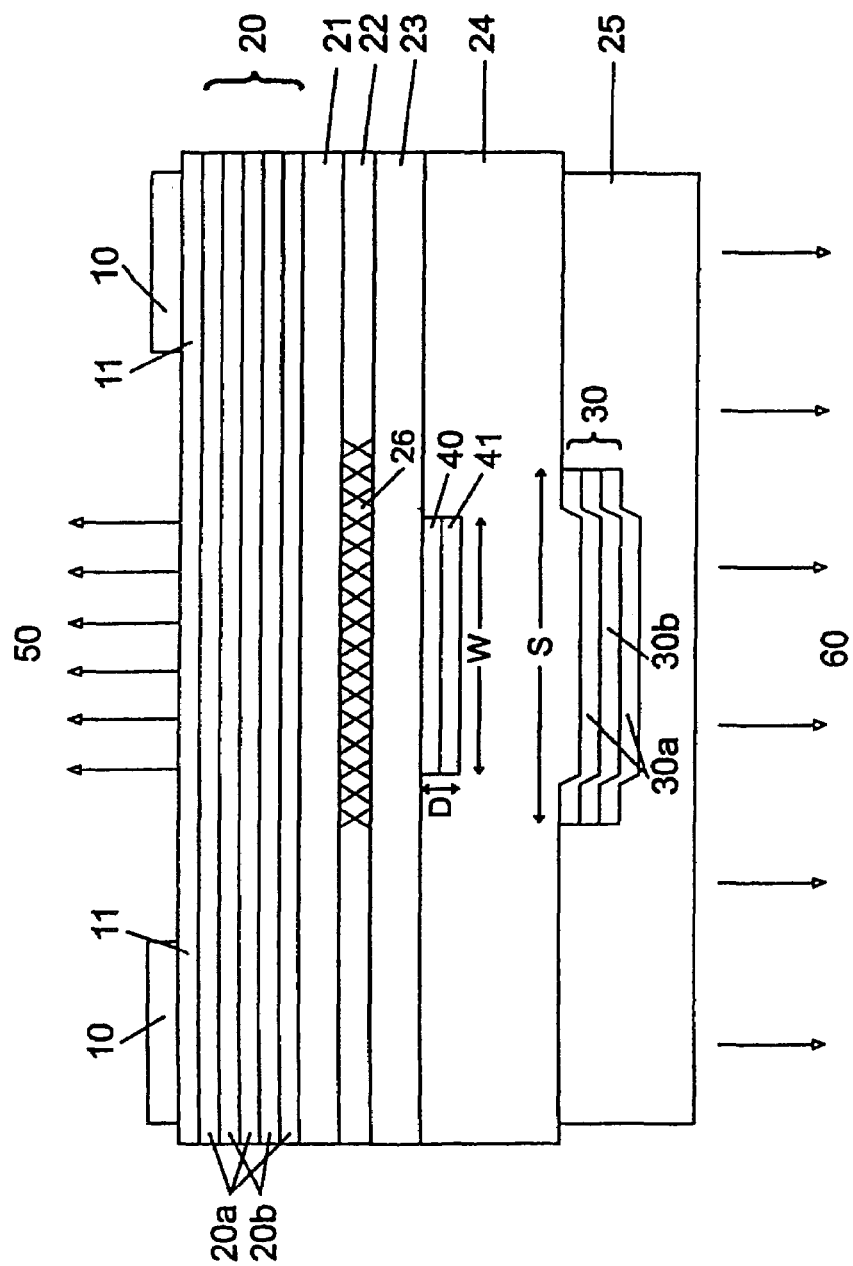
FIG. 2 shows a second embodiment of the invention.

FIG. 2 shows a second embodiment of the invention. In contrast to FIG. 1, the manufacturing process is such that the structure of the tunnel contact is imaged in the epitaxy overgrowing into the surface of the layer (24). This results in increased lateral wave guiding which is aligned precisely, in self-adjusting manner, with the tunnel contact and the active region (26). Depending on the course of the process, the imaging of the tunnel contact may be widened or reduced, thus allowing, the lateral limits of the optical field to be influenced over a wide range. This method may be combined with the structural variants described below in order to optimize laser properties.

Figure 3:
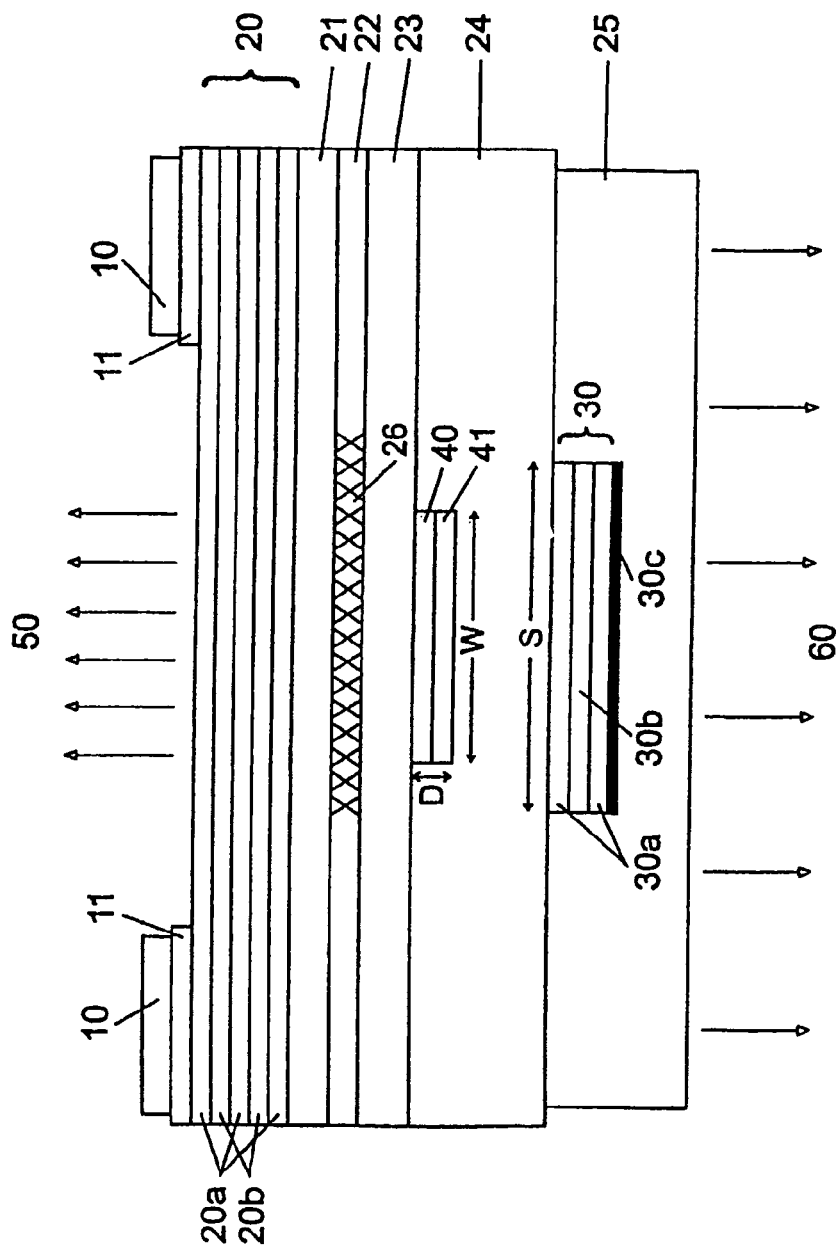
FIG. 3 shows a third embodiment of the invention.

FIG. 3 shows a third embodiment of the invention. It is clearly emphasized here that the application of an additional highly reflective metallic layer (30c) onto the dielectric mirror (30) as a whole can produce high reflectivity which in this embodiment does not depend on the properties of the integrated heat sink and contact layer (25).

Figure 4:
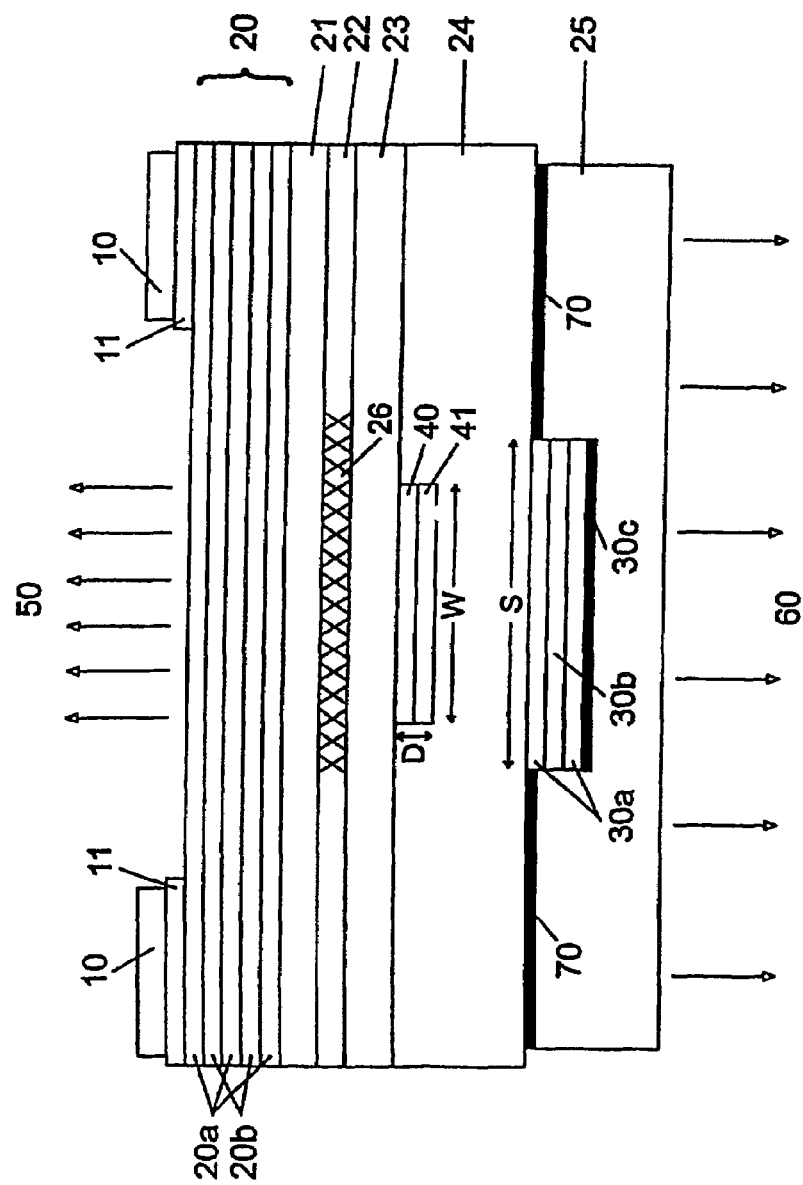
FIG. 4 shows a fourth embodiment of the invention.

FIG. 4 shows a fourth embodiment of the invention. In this embodiment the contact resistance to the contact layer (25) on the p side can be reduced by lateral insertion of a highly n-doped intermediate contact layer (70). For example, the layer (24) may consist of thermally highly conductive n-doped InP and the intermediate contact layer (70) may consist of highly n-doped InGaAs, which produces very low contact resistances.

Figure 5:
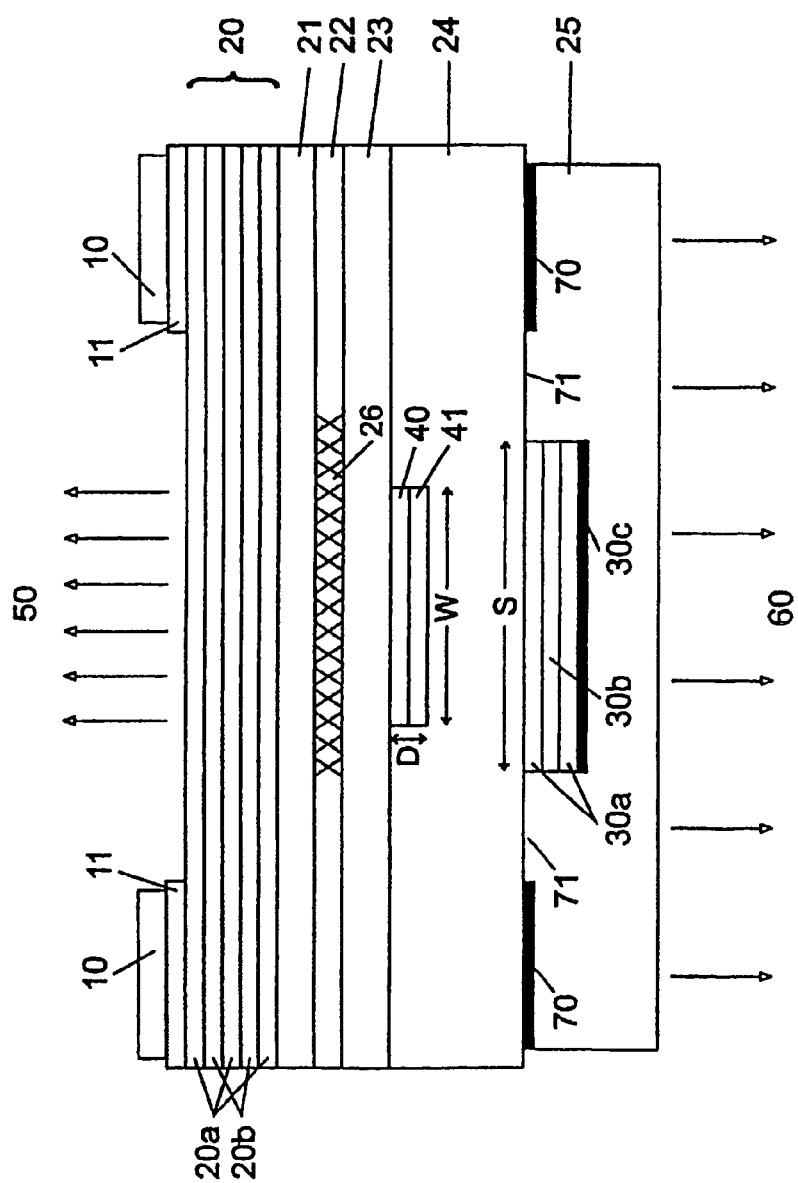
FIG. 5 shows a fifth embodiment of the invention.

As the n-doped intermediate contact layer according to the FIG. 4 may be a poor conductor of heat, as in the case of InGaAs, FIG. 5 shows a fifth embodiment of the invention in which both low-impedance contact by means of the intermediate contact layer (70) and also a good discharge of heat through the window (71) are made possible by the fact that an intermediate space is provided between the dielectric mirror (30) and the intermediate contact layer (70), through which the heat is able to flow away. The lateral width of the region (71) is therefore preferably greater than the thickness of the layer (24).

Figure 6:
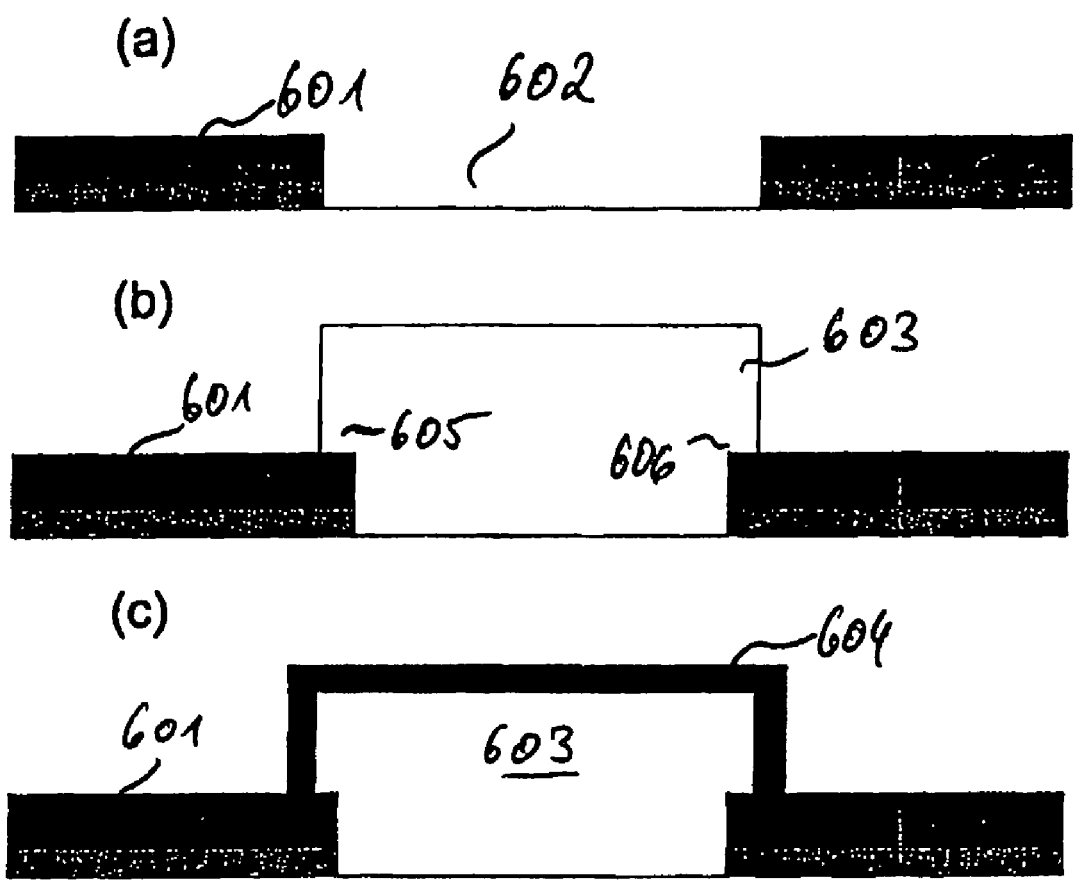
FIG. 6 shows three process steps for preparing a diffusion barrier according to a first embodiment.

FIG. 6 shows three process steps for producing a diffusion barrier according to a first embodiment.

In a first step (a) a diffusion barrier 601 is applied to a first area, while a second area 602 is masked. The diffusion barrier may consist of platinum (Pt), for example. In order to achieve better adhesion to the underlying n-doped semiconductor layer, a layer of titanium may be applied underneath the layer of platinum. Finally, a layer of gold may be applied to the layer of platinum. In this form the diffusion barrier then consists of layers of Ti/Pt/Au.

In a second step (b) a dielectric mirror 603 is applied in the second region 602. A certain overlap with the diffusion barrier 601 may be allowed at the points 605, 606. The advantage of this overlap is that a tight seal can be guaranteed between the dielectric mirror and the diffusion barrier so as to safely rule out any possibility of diffusion from the contact layer into the n-doped semiconductor layer.

Finally, in a third step (c), a layer of gold 604 is applied to the dielectric mirror 603.

Figure 7:
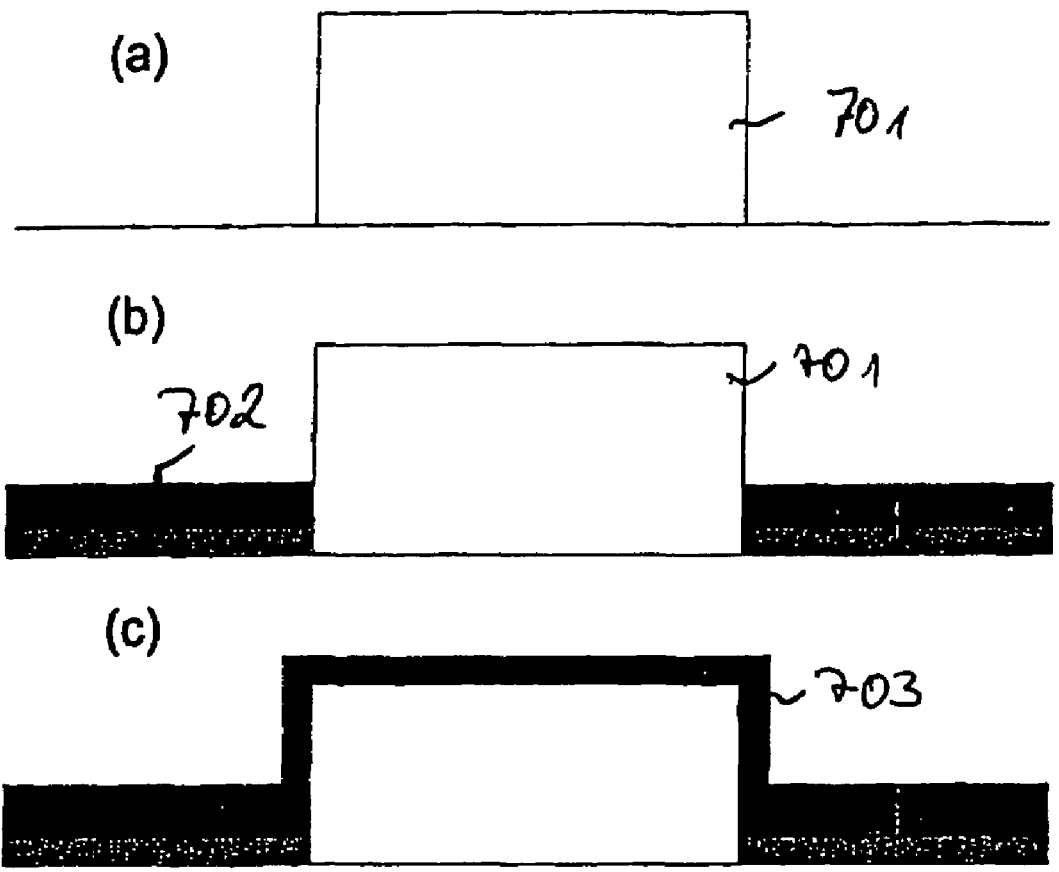
FIG. 7 shows three process steps for preparing a diffusion barrier according to a second embodiment.

FIG. 7 shows three process steps for the preparation of a diffusion barrier according to a second embodiment. The main difference from the process steps according to FIG. 6 is that, in a first process step (a), first of all a dielectric mirror is applied and in a second process step (b) the diffusion barrier 702 is then applied which may in turn consist of the sequence of layers Ti/Pt/Au mentioned above. Then, in a third step (c), a layer of gold 703 is applied to the dielectric mirror. In the process sequence according to FIG. 7, the masking is precisely adjusted so as to prevent diffusion between the dielectric mirror and the n-doped semiconductor layer underneath it, as before.

Table 1, finally, lists some exemplary data for a semiconductor diode according to the invention, the numbers in the first column referring to the reference numerals in the figures.

TABLE 1

Typical data for a semiconductor diode according to the invention with a wavelength of 1.55 μm. $\lambda_g$ indicates the wavelength corresponding to the band spacing.

| No. | | Material | Doping (cm-3) | Thickness (nm) | Diameter (μm) | Note |
|---|---|---|---|---|---|---|
| 10 | | Ti: 10 nm<br>Pt: 20 nm<br>Au: 500 nm | | ca. 530 | 55 on the inside<br>240 on the outside | |
| 11 | | InGaAs (lattice matched to InP) | $n = 5 \times 10^{19}$ | 100 | 50 on the inside<br>250 on the outside | |
| 20 | 20a | InGaAlAs (refractive index approx 3.48) | $n = 2 \times 10^{18}$ | 111 | 250 | Repeated 36 times |
| | 20b | InAlAs (refractive index approx 3.2) | $n = 2 \times 10^{18}$ | 121 | 250 | |
| 21 | | InAlAs | $n = 5 \times 10^{17}$ | 50 | 250 | |
| 22 | | InGaAlAs ($\lambda_g = 1.1$ μm): 20 nm<br>InGaAlAs ($\lambda_g = 1.7$ μm): 8 nm<br>InGaAlAs ($\lambda_g = 1.1$ μm): 7 nm<br>InGaAlAs ($\lambda_g = 1.7$ μm): 8 nm<br>InGaAlAs ($\lambda_g = 1.1$ μm): 7 nm<br>InGaAlAs ($\lambda_g = 1.7$ μm): 8 nm | Undoped | 108 | 250 | |

TABLE 1-continued

Typical data for a semiconductor diode according to the invention with a wavelength of 1.55 μm. $\lambda_g$ indicates the wavelength corresponding to the band spacing.

| No. | | Material | Doping (cm-3) | Thickness (nm) | Diameter (μm) | Note |
|---|---|---|---|---|---|---|
| | | InGaAlAs ($\lambda_g$ = 1.1 μm): 7 nm | | | | |
| | | InGaAlAs ($\lambda_g$ = 1.7 μm): 8 nm | | | | |
| | | InGaAlAs ($\lambda_g$ = 1.1 μm): 7 nm | | | | |
| | | InGaAlAs ($\lambda_g$ = 1.7 μm): 8 nm | | | | |
| | | InGaAlAs ($\lambda_g$ = 1.1 μm): 20 nm | | | | |
| 23 | | InAlAs | p = 5 × 10$^{17}$ | 50 | 250 | |
| 24 | | InP | n = 1 – 5 × 10$^{18}$ | | | |
| 25 | | Ti: 10 nm | | ca. 50 μm | 250 | |
| | | Pt: 20 nm | | | | |
| | | Au: 50 μm | | | | |
| 30 | 30a | MgF$_2$ | | 280 | 12 | 2× |
| | 30b | Si | | 110 | 12 | 1× |
| 40 | | InGaAlAs ($\lambda_g$ = 1.4 μm) | p = 10$^{20}$ | 20 | 8 | |
| 41 | | InGaAs (lattice matched to InP) | n = 10$^{20}$ | 20 | 8 | |
| 50 | | Light exit aperture | | ca. 50 μm | | |
| 60 | | Discharge of heat | | ca. 250 μm | | |

What is claimed is:

1. A semiconductor laser of the surface emitting type, comprising:
    an active zone having a pn transition;
    a first n-doped semiconductor layer on an n side of the active zone,
    a structured tunnel contact on a p side of the active zone which forms a conductive transition to a second n-doped semiconductor layer on the p side of the active zone;
    a structured dielectric mirror which is applied to the second n-doped semiconductor layer;
    a contact layer which forms a contact with the second n-doped semiconductor layer at points where the dielectric mirror is not applied; and
    a diffusion barrier between the contact layer and the second n-doped semiconductor layer, wherein the dielectric mirror laterally partially overlaps the diffusion barrier.

2. A semiconductor laser according to claim 1, comprising an adhesion promoter between the diffusion barrier and the second semiconductor layer.

3. A semiconductor laser according to claim 2, the adhesion promoter comprising a layer of titanium.

4. A semiconductor laser according to claim 1, the diffusion barrier comprising a layer of platinum.

5. A semiconductor laser according to claim 1, further comprising a metallic covering layer between the dielectric mirror and the contact layer for increasing reflectivity.

6. A semiconductor laser according to claim 5, the metallic covering layer located through and between the diffusion barrier and the contact layer.

7. A semiconductor laser according to claim 6, the metallic covering layer comprising gold.

8. A semiconductor laser according to claim 1, the contact layer comprising one of gold and silver.

9. A semiconductor laser according to claim 1, the dielectric mirror having a lower heat resistance than semiconductor materials.

10. A semiconductor laser according to claim 1, wherein the second n-doped semiconductor layer comprises an InP semiconductor.

11. A semiconductor laser according to claim 1, the contact layer having sufficient thickness to act as a heat sink.

12. A semiconductor laser according to claim 11, the contact layer being more than 10 μm thick.

13. A semiconductor laser according to claim 1, wherein light is decoupled on the n side of the active zone.

14. A semiconductor laser according to claim 13, further comprising a substrate removed from the n side of the active zone.

15. A semiconductor laser according to claim 14, the contact layer having sufficient thickness to ensure mechanical stability of the semiconductor laser with the substrate removed from the n side of the active zone.

16. A process for producing a diffusion barrier in a semiconductor laser with an active zone having a pn transition, comprising:
    forming a first n-doped semiconductor layer on an n side of the active zone,
    forming a structured tunnel contact on a p side of the active zone which forms a conductive transition to a second n-doped semiconductor layer on the p side of the active zone,
    applying a diffusion barrier to the second n-doped semiconductor layer;
    applying a dielectric mirror to the second n-doped semiconductor layer such that the dielectric mirror laterally partially overlaps the diffusion barrier; and
    applying a contact layer at least over the diffusion barrier.

17. A process according to claim 16, wherein applying the dielectric mirror comprises applying the dielectric mirror before the diffusion barrier is applied.

18. A process according to claim 16, wherein applying the dielectric mirror comprises applying the dielectric mirror after the diffusion barrier is applied.

19. A process according to claim 16, further comprising applying an adhesion promoter before the diffusion barrier.

20. A process according to claim 19, wherein applying the adhesion promoter comprises utilizing titanium.

21. A process according to claim 16, the step of applying a diffusion barrier comprising utilizing platinum.

22. A process according to claim 16, wherein applying the contact layer comprises applying a metallic contact layer over an entire surface of the diffusion barrier and the dielectric mirror.

23. A process according to claim 22, wherein applying the metallic contact layer comprises forming the metallic contact layer from one of gold and silver.

24. A process according to claim 22, further comprising applying a metallic covering layer before the contact layer is applied over the dielectric mirror.

25. A process according to claim 22, further comprising applying a metallic covering layer before the contact layer is applied over the entire surface of the dielectric mirror and the diffusion barrier.

26. A process according to claim 24, wherein applying the metallic covering layer comprises forming the metallic covering layer from gold.

27. A semiconductor laser according to claim 1, the dielectric mirror laterally adjoining the diffusion barrier.

* * * * *

UNITED STATES PATENT AND TRADEMARK OFFICE
CERTIFICATE OF CORRECTION

PATENT NO. : 7,170,917 B2
APPLICATION NO. : 10/468183
DATED : January 30, 2007
INVENTOR(S) : Markus-Christian Amann and Markus Ortsiefer Page 1 of 1

It is certified that error appears in the above-identified patent and that said Letters Patent is hereby corrected as shown below:

Title page, Item (73) Assignee, "Vercilas GmbH" should read --Vertilas GmbH--

Signed and Sealed this

Twenty-fourth Day of April, 2007

JON W. DUDAS
*Director of the United States Patent and Trademark Office*